(12) United States Patent
Kim et al.

(10) Patent No.: US 6,703,559 B2
(45) Date of Patent: Mar. 9, 2004

(54) FEEDTHROUGH ASSEMBLY HAVING CUT-OUT AREAS IN METAL HOUSING ADJACENT CERAMIC FEEDTHROUGH

(75) Inventors: Franklin Kim, Bonita, CA (US); Eiji Watanabe, San Diego, CA (US); Nobuo Takeshita, San Diego, CA (US)

(73) Assignee: Kyocera America, Inc., San Diego, CA (US)

(*) Notice: Subject to any disclaimer, the term of this patent is extended or adjusted under 35 U.S.C. 154(b) by 185 days.

(21) Appl. No.: 09/909,702

(22) Filed: Jul. 19, 2001

(65) Prior Publication Data

US 2003/0015350 A1 Jan. 23, 2003

(51) Int. Cl.⁷ .............................. H01J 15/00; H01J 5/00; H05K 5/06
(52) U.S. Cl. ................................ 174/50.54; 174/65 R
(58) Field of Search .............................. 174/261, 50.54, 174/65 R; 361/736–745

(56) References Cited

U.S. PATENT DOCUMENTS

| | | | | |
|---|---|---|---|---|
| 4,672,151 A | * | 6/1987 | Yamamura | 174/52.4 |
| 4,839,716 A | * | 6/1989 | Butt | 257/660 |
| 4,967,315 A | * | 10/1990 | Schelhorn | 361/818 |
| 5,157,588 A | * | 10/1992 | Kim et al. | 361/736 |
| 6,204,448 B1 | * | 3/2001 | Garland et al. | 174/52.3 |

* cited by examiner

Primary Examiner—John B. Vigushin
Assistant Examiner—Jeremy Norris
(74) Attorney, Agent, or Firm—Hogan & Hartson, LLP

(57) ABSTRACT

Feedthrough apparatus has a metal housing with an opening therein and a base having a surface at the opening. A ceramic feedthrough extends through the opening in the housing and forms an interface therewith, and is brazed to the housing at the interface. The surface of the base extends at least to the feedthrough and has a cut-out area or opening therein adjacent the feedthrough in order to minimize the surface area contact at the interface between the ceramic feedthrough and the metal housing. The opening in the base may have edges which extend from sidewalls of the feedthrough under the feedthrough by small distances, in order to form a small ledge beneath the outer periphery of the feedthrough. Alternatively, the opening in the base may be approximately equal in size to the feedthrough so as to have edges which engage sidewalls of the feedthrough. The design of the feedthrough apparatus with its minimum of surface interface between the ceramic feedthrough and the metal housing provides for relaxed tolerances therebetween and permits brazing of the feedthrough at the opening within the housing using a high temperature brazing compound.

8 Claims, 5 Drawing Sheets

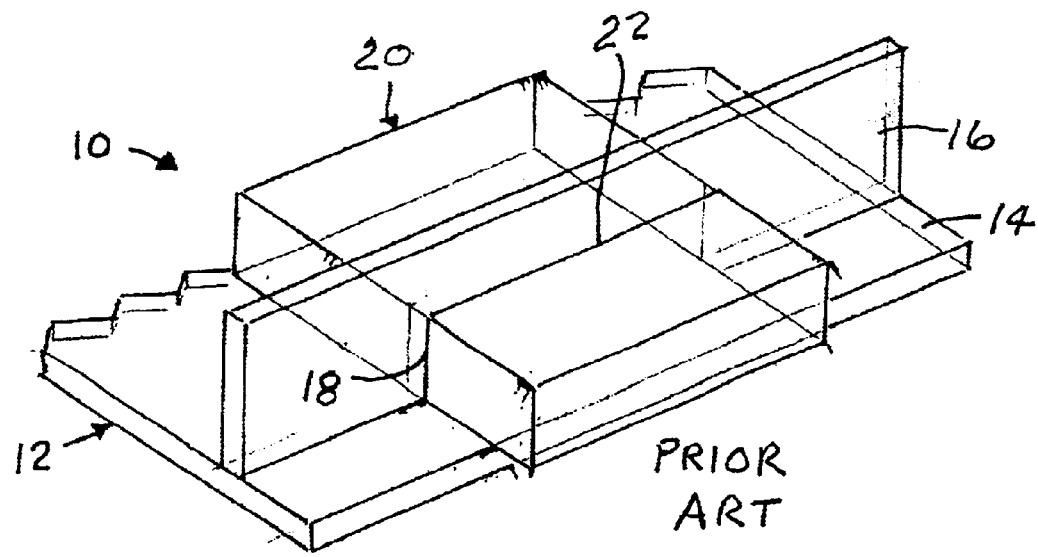
FIG. 1 PRIOR ART
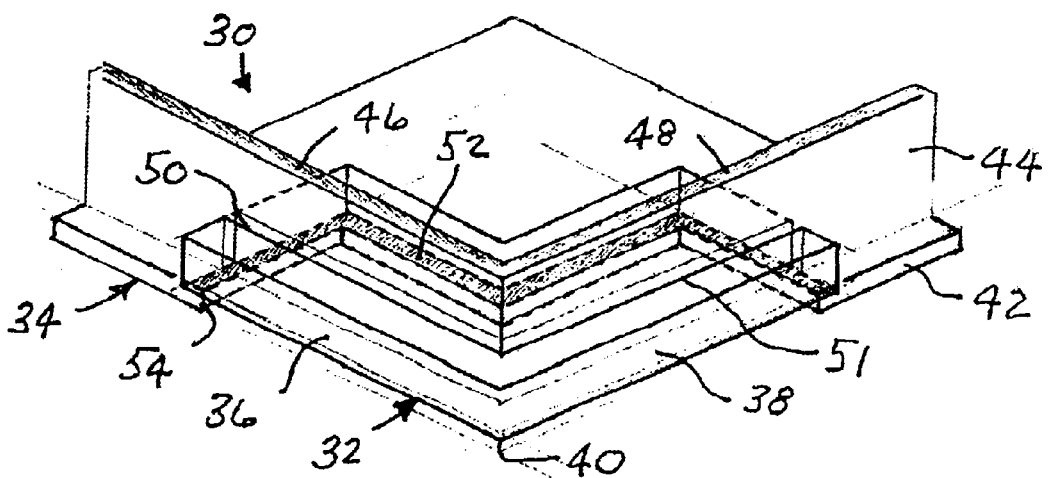
FIG. 2
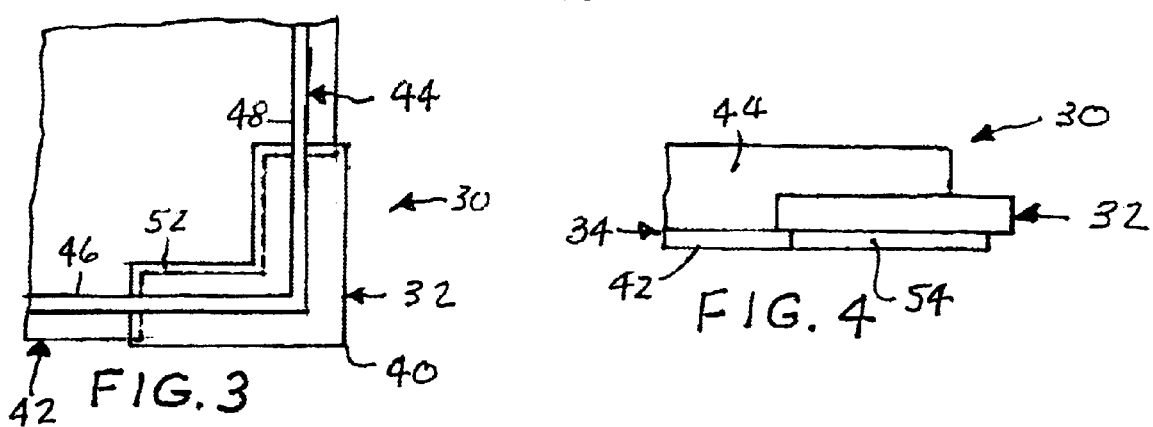
FIG. 3
FIG. 4

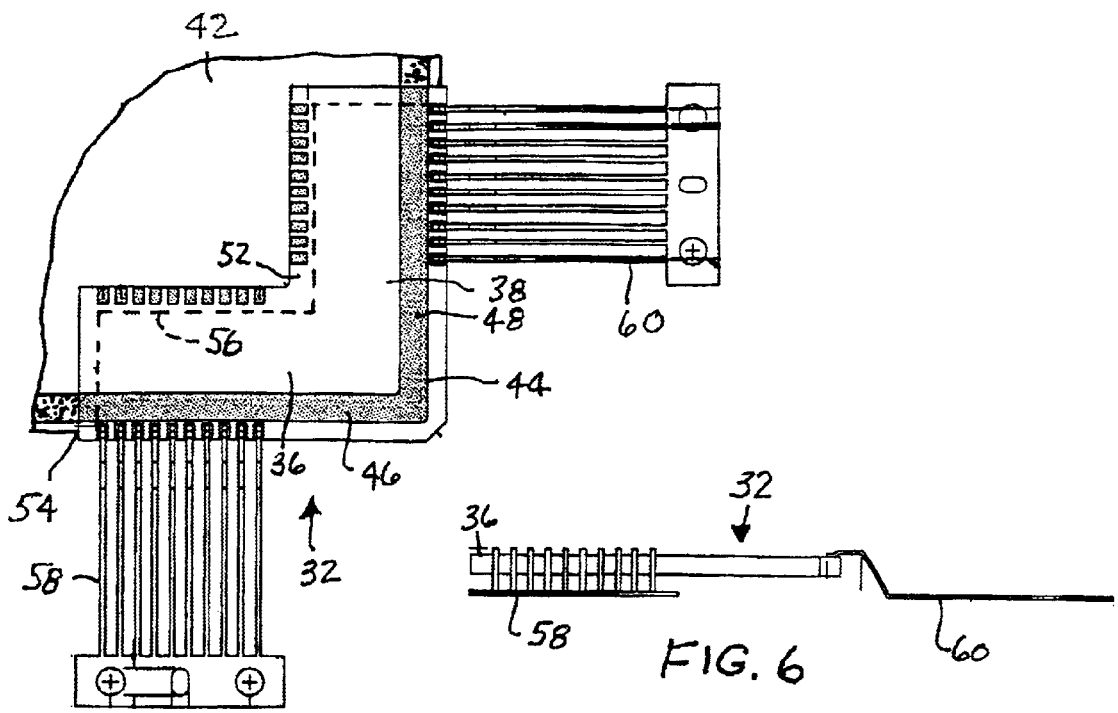
FIG. 5
FIG. 6
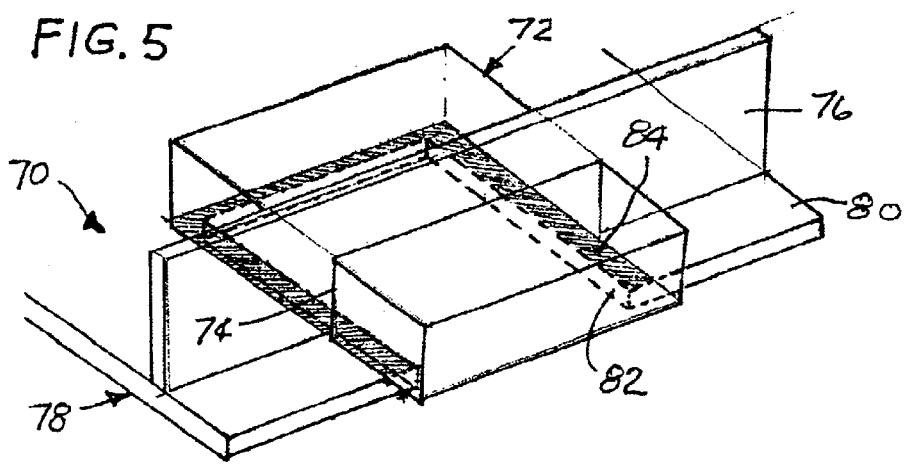
FIG. 7
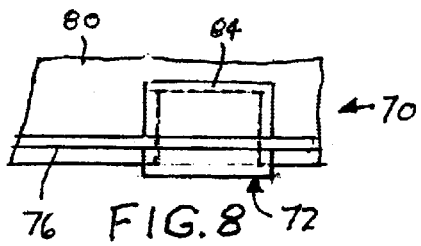
FIG. 8
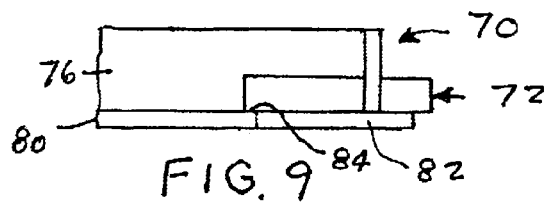
FIG. 9

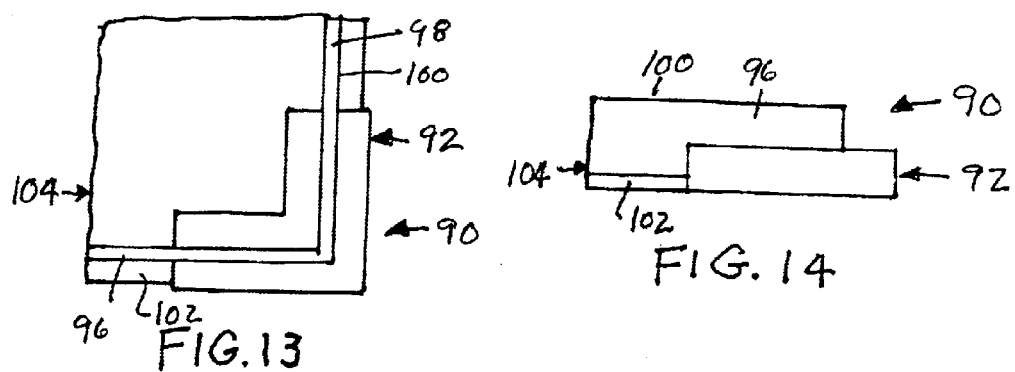
FIG. 13
FIG. 14
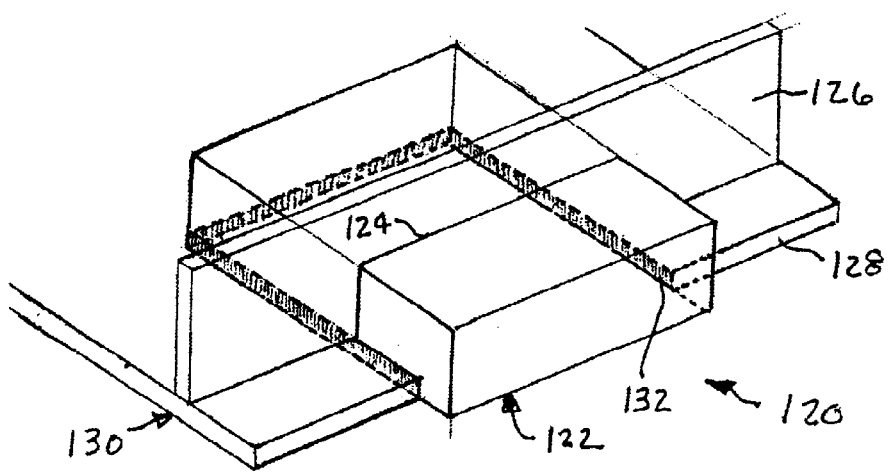
FIG. 15
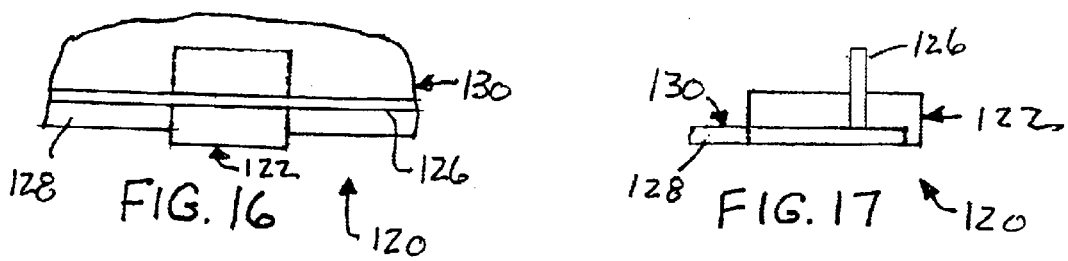
FIG. 16
FIG. 17

FEEDTHROUGH ASSEMBLY HAVING CUT-OUT AREAS IN METAL HOUSING ADJACENT CERAMIC FEEDTHROUGH

BACKGROUND OF THE INVENTION

1. Field of the Invention

The present invention relates to feedthrough assemblies for electrical or optical interconnection to the inside of a housing in sealed fashion, and more particularly to a feedthrough assembly in which a ceramic feedthrough is mounted within and brazed to an opening in a metal housing to provide a hermetic seal.

2. History of the Prior Art

It is known to provide feedthrough assemblies in which a feedthrough is mounted within an opening in a housing so as to extend from the outside to the inside of the housing. The feedthrough may be used to provide electrical or optical interconnection to the inside of the housing. An interface or joint between the feedthrough and the housing is typically brazed to provide the housing package with hermeticity.

In feedthrough assemblies of this type, the feedthrough is typically made of ceramic and the housing is typically made of a metal such as a nickel alloy. Brazing is typically carried out using a brazing compound comprised of a metal or mixture of metals. Because there is a substantial difference in the coefficient of thermal expansion between the ceramic of the feedthrough and the metal of the housing, the brazing operation often results in deformation or cracking of the material with the lower flexural strength. This is particularly true in the case of brazing compound materials such as those having a mixture of silver and copper which must be brazed at high temperatures of typically at least 780° C. or more. Because of the problems attendant with such high temperature brazing, lower temperature brazing must often be used. For example, a gold and tin mixture can be brazed at approximately 300° C. This minimizes the effects of the thermal mismatch between the ceramic and the metal, but at the expense of lower yield and higher cost.

To facilitate the brazing operation at both high and low temperatures, it is desirable to provide feedthrough assemblies in which the tight dimensional requirements of the ceramic-metal interface are relaxed. Desirably, the total overall dimensions of the ceramic feedthrough are kept to a minimum. However, this is not always possible, such as in applications where larger feedthroughs must be used. Certain assembly designs reduce the contact area between the ceramic feedthrough and the metal wall to a limited extent, thereby facilitating the brazing operation.

Nevertheless, conventional feedthrough assemblies are lacking in their ability to significantly relax the interface tolerance requirements and significantly reduce the surface area of contact between the feedthrough and the housings, so as to make the brazing operation significantly easier and more trouble-free. In particular, it is desirable that the assembly designs facilitate greater application of high temperature brazing.

BRIEF SUMMARY OF THE INVENTION

Feedthrough assemblies in accordance with the invention reduce the requirement for close tolerances at the feedthrough-housing interface and facilitate the use of high temperature brazing, where desired, without the usual attendant problems such as deformation or cracking resulting from the thermal mismatch between the ceramic and the metal. This is accomplished in accordance with the invention by minimizing the surface area of contact between the ceramic feedthrough and the metal housing, particularly in the region of the lower surface of the feedthrough and the portion of the generally planar base of the housing which typically extends thereunder. In feedthrough assemblies according to the invention, the base of the housing is provided with an opening beneath the feedthrough. The opening preferably extends through an area which is not substantially smaller in size than the bottom of the feedthrough, and may extend under the opposite edges of the feedthrough by a small distance so as to define ledges thereunder. At the same time, the surface area of the interface between the base of the housing and the feedthrough is greatly minimized, and with it the thermal mismatch problems which accompany the operation when the feedthrough is brazed in place within the housing. Alternatively, the opening in the base may be made approximately equal in size to the feedthrough. In such arrangements, the edges of the opening may frame and abut the back and opposite side walls of the feedthrough so as to minimize the surface area of contact therebetween even further.

Feedthrough assemblies in accordance with the invention also eliminate the tight dimensional requirements of prior art arrangements by way of a cut-out design that allows the feedthrough to be placed through a corner of the housing rather than through a side of the housing. The side wall of the housing is mounted on the base thereof so as to have an opening at a corner of the base. The feedthrough is formed so as to be generally L-shaped in configuration and so as to reside within the opening in the side wall. The L-shaped feedthrough is comprised of two leg portions which are joined at a generally right angle at the corner of the base plate and which include a pair of lead frames extending from the two leg portions to the outside of the housing. This permits a large feedthrough at both sides of the housing. Again, the base of the housing is provided with an opening beneath the feedthrough, and the opening either extends to positions close to or at the back and side surfaces of the feedthrough, so as to minimize the surface area of contact between the housing and the feedthrough. The opening may either form small ledges in the base beneath the side surfaces of the feedthrough, or it may be generally coextensive with the feedthrough so that the edges of the opening abut the side walls of the feedthrough.

In a still further embodiment of a feedthrough assembly according to the invention, the base of the housing is provided with a slot in the underside thereof which extends into the base from a side edge thereof. The slot extends upwardly through part but not all of the thickness of the base. A feedthrough is mounted within the slot in the base. The base has an opening therein adjacent the feedthrough which extends from an upper surface of the slot through the remainder of the thickness of the base, to substantially reduce the surface area of contact between the feedthrough and the housing and to provide access to the feedthrough from inside the housing. The slot, the feedthrough and the opening may be generally rectangular in shape, and the slot and the feedthrough are similar in size with the opening being slightly smaller.

The feedthrough is typically made of ceramic and the housing is made of a metal such as a nickel alloy. In spite of the substantial differences in the temperature coefficients of the ceramic and metal, brazing can be successfully accomplished using a high temperature braze such as that required for a brazing mixture of silver and copper. Again, the designs of the feedthrough assembly with their minimum area of contact between the ceramic and the metal permit the use of such high temperature brazing.

BRIEF DESCRIPTION OF THE DRAWINGS

The foregoing and other objects, aspects and advantages will be better understood from the following detailed description of preferred embodiments of the invention with reference to the drawings, in which:

FIG. 1 is a perspective view of a conventional feedthrough assembly;

FIG. 2 is a perspective view of a feedthrough assembly in accordance with the invention;

FIG. 3 is a top view of the assembly of FIG. 2;

FIG. 4 is a side view of the assembly of FIG. 2;

FIG. 5 is a detailed top view of the feedthrough of the assembly of FIG. 2;

FIG. 6 is a detailed side view of the feedthrough of FIG. 5;

FIG. 7 is a perspective view of an alternative embodiment of a feedthrough assembly in accordance with the invention;

FIG. 8 is a top view of the assembly of FIG. 7;

FIG. 9 is a side view of the assembly of FIG. 7;

FIG. 13 is a top view of the assembly of FIG. 12;

FIG. 14 is a side view of the assembly of FIG. 12;

FIG. 15 is a perspective of a still further alternative embodiment of a feedthrough assembly in accordance with the invention;

FIG. 16 is a top view of the assembly of FIG. 15;

FIG. 17 is a side view of the assembly of FIG. 15; and

DETAILED DESCRIPTION

Figure 10:
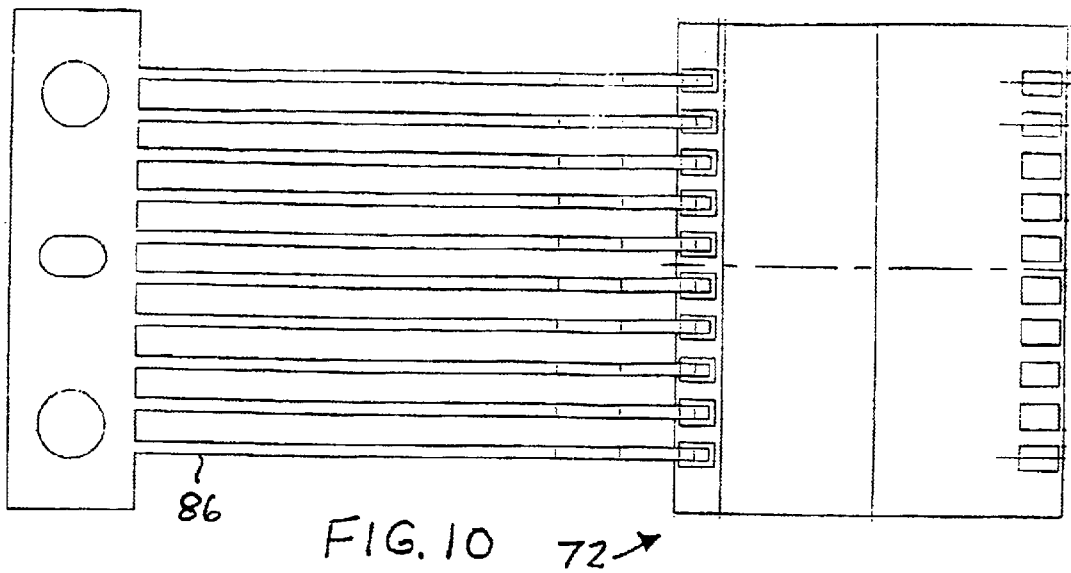
FIG. 10 is a detailed top view of the feedthrough of the assembly of FIG. 7.

FIG. 1 is a perspective view of a conventional feedthrough design or assembly 10. The feedthrough assembly 10 includes a housing 12 which has a generally planar base 14 and a sidewall 16 extending upwardly therefrom. The sidewall 16 has an opening 18 for receiving a feedthrough 20. The feedthrough 20 may be for electrical or optical applications, and provides connections from outside the housing 12 to a location inside the housing 12. The feedthrough 20 is mounted within the opening 18 in the sidewall 16 and is brazed to the housing 12 by a braze joint 22 around the opening 18. The braze joint 22 provides hermeticity by sealing the interior of the housing 12 from the outside thereof where the feedthrough 20 passes through.

The feedthrough 20 is typically made of ceramic material, and the housing 12 with the base 14 and the sidewall 16 thereof is typically made of metal such as a nickel alloy. Typically, the thermal coefficient of expansion of the ceramic of the feedthrough 20 is substantially different from the thermal coefficient of expansion of the metal forming the base 14 and the sidewall 16 of the housing 12. Because of the large mismatch in the coefficient of thermal expansion between the ceramic material of the feedthrough 20 and the metal of the housing 12, low temperature brazing must often be used when forming the braze joint 22. Typically, the brazing material used contains the combination of gold (Au) and tin (Su) which can be brazed at a relatively low temperature on the order of 300–350° C. The low temperature brazing minimizes the stress exerted on the ceramic, and eliminates ceramic cracks caused by the stress. However, such low temperature brazing is expensive, provides a relatively low yield, and is not always that effective.

The present invention involves the recognition that more desirable high temperature brazing can be used in connection with tolerances between the feedthrough and the housing which are substantially relaxed, by minimizing the ceramic-metal interface. The ceramic-metal interface can be minimized, as described hereafter, by removing most or all of the base of the housing beneath the feedthrough. The base is provided with an opening beneath the feedthrough which forms only a small ledge beneath the feedthrough, or alternatively, is completely cut away so as to receive the feedthrough at edges formed by the opening within the base.

FIG. 2 is a perspective view of a corner feedthrough assembly 30 in accordance with the invention. The corner feedthrough assembly 30 avoids the need for tight tolerances and enables a feedthrough 32 thereof to provide coupling to the inside of a housing 34 from two different sides thereof. The feedthrough 32 is generally L-shaped and is comprised of two different legs 36 and 38 which form a generally right angle therebetween. The legs 36 and 38 form a right angle at a corner 40 of the housing 34. The housing 34 is comprised of a generally planar base 42 and a sidewall 44 mounted on and extending upwardly from the base 42. The sidewall 44 is comprised of two different elongated portions 46 and 48 thereof which join each other at a right angle, at the corner 40.

The L-shaped feedthrough 32 of the corner feedthrough assembly 30 extends through an aperture 50 in the portions 46 and 48 of the side wall 44. The feedthrough 32 is brazed to the housing 34 so as to form a braze joint 51 around the aperture 50.

In accordance with the invention, a substantial portion of the base 42 beneath the feedthrough 32 is removed. In the example of FIG. 2, only a small portion of the base 42 extends beyond the side walls of the feedthrough 32 beneath the bottom thereof so as to form a supporting ledge 52. Consequently, the base 42 is provided with an opening 54 therein beneath the feedthrough 32. The opening 54 is generally L-shaped, as is the feedthrough 32, and is generally coextensive therewith except for the small portion of the base 42 forming the ledge 52 beneath the feedthrough 32.

By removing a substantial portion of the base 42 beneath the feedthrough 32, in accordance with the invention, the ceramic-metal interface between the feedthrough 32 and the housing 34 is minimized. Consequently, tight tolerances between the feedthrough 32 and the housing 34 are relaxed. The surface contact of the brazed joint is minimized, and high temperature brazing can be used without concern as to thermal mismatch and the attendant stress and cracking that would otherwise occur.

FIG. 5 is a detailed top view of the feedthrough 32 of FIGS. 2–4 in conjunction with the base 42 and the portions 46 and 48 forming the sidewall 44. The opening 54 within the base 42 provides the base 42 with edges shown in dotted outline 56 which extend under the L-shaped feedthrough 32 by a relatively small distance so as to form the ledge 52. The surface area of the ceramic-metal interface that would otherwise exist is substantially minimized because of the opening 54. The feedthrough 32 is comprised of the legs 36 and 38 thereof which form a generally right angle with each other. The leg 36 is coupled at the outside thereof to a lead frame 58. Similarly, the leg 38 of the feedthrough 32 is coupled at a portion thereof outside of the portion 48 of the side wall 44 to a lead frame 60. The lead frames 58 and 60 provide electrical interconnection from outside of the housing 34 to the inside of the legs 36 and 38 of the feedthrough 32. FIG. 6 is a detailed side view of the feedthrough 32, showing the lead frames 58 and 60 thereof.

FIG. 7 is a perspective view of an alternative embodiment of a feedthrough assembly 70 in accordance with the invention. FIGS. 8 and 9 are respectively top and side views of the feedthrough assembly 70 of FIG. 7. The feedthrough assembly 70 of FIGS. 7–9 is similar to the conventional feedthrough assembly 10 of FIG. 1, in that a generally rectangular feedthrough 72 extends through an opening 74 in a side wall 76 of a housing 78 to the interior of the housing 78. A bottom surface of the feedthrough 72 generally coincides with a top surface of a generally planar base 80 of the housing 78. However, in accordance with the invention, a substantial portion of the base 80 beneath the feedthrough 72 is removed so as to form an opening 82 therein. The opening 82 terminates at edges of the base 80 which extend by a relatively small distance beneath the feedthrough 72 from the side walls of the feedthrough, to form a ledge 84 beneath the outer edges of the feedthrough 72. Again, the opening 82 greatly minimizes the surface contact between the ceramic of the feedthrough 72 and the metal of the housing 78, in accordance with the invention.

Figure 11:
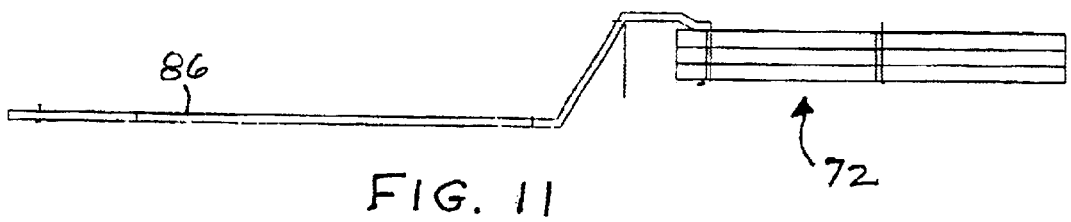
FIG. 11 is a detailed side view of the feedthrough of FIG. 10.

FIGS. 10 and 11 are respectively detailed top and side views of the feedthrough 72 of the feedthrough assembly 70 of FIGS. 7–9. As shown in FIGS. 10 and 11, the feedthrough assembly 70 includes a lead frame 86 coupled to an outer edge of the feedthrough 72 so as to extend outside of the housing 78. The lead frame 86 provides electrical interconnection from outside the housing 78 of the feedthrough assembly 70 to the inside of the housing. The configuration of the feedthrough 72 and the associated lead frame 86 is similar to each of the opposite sides of the feedthrough 32 shown in FIGS. 5 and 6.

Figure 12:
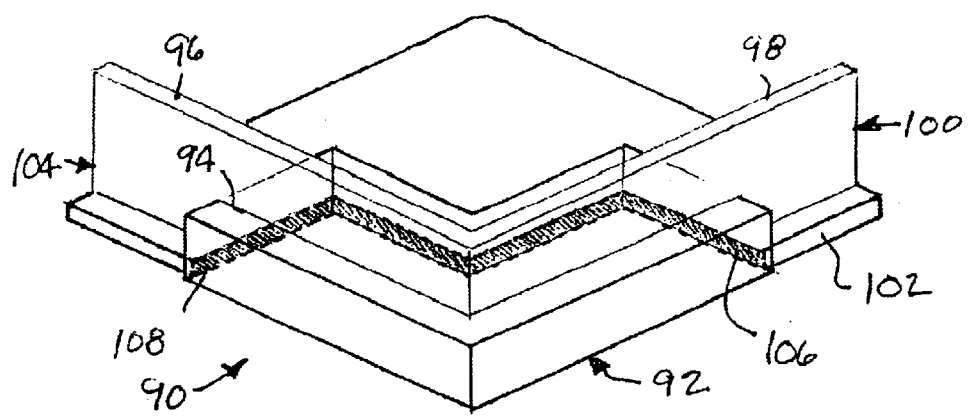
FIG. 12 is a perspective view of a further alternative embodiment of a feedthrough assembly in accordance with the invention.

FIG. 12 is a perspective view of a further alternative embodiment of a feedthrough assembly 90 in accordance with the invention. FIGS. 13 and 14 are respectively top and side views of the feedthrough assembly 90 of FIG. 12. The feedthrough assembly 90 of FIGS. 12–14 is similar to the corner feedthrough assembly 30 of FIGS. 2–4. The generally L-shaped feedthrough 92 thereof extends through an aperture 94 within elongated portions 96 and 98 of a sidewall 100 mounted on and extending upwardly from a generally planar base 102 of a housing 104. The base 102 has an opening 106 therein beneath the feedthrough 92. However, unlike the corner feedthrough assembly 30 of FIGS. 2–4, the opening 106 in the base 102 of the feedthrough assembly 90 of FIGS. 12–14 is generally coextensive with the bottom of the feedthrough 92 so as to provide the base 102 with edges 108 which engage various side walls of the feedthrough 92. Consequently, the feedthrough assembly 90 of FIGS. 12–14 greatly minimizes the area of surface contact between the ceramic feedthrough 92 and the housing 104, in accordance with the invention.

FIG. 15 is a perspective view of a still further alternative embodiment of a feedthrough assembly 120 in accordance with the invention. FIGS. 16 and 17 are respectively top and side views of the feedthrough assembly 120 of FIG. 15. The feedthrough assembly 120 is similar to the feedthrough assembly 70 shown in FIGS. 7–9. As such, the feedthrough assembly 120 includes a generally rectangular feedthrough 122 disposed within and extending through an opening 124 and a sidewall 126 which extends upwardly from a base 128 of a housing 130. The base 128 has an opening 132 therein beneath the feedthrough 122. However, unlike the opening 82 in the base 80 of the feedthrough assembly 70 of FIGS. 7–9, the opening 132 is generally coextensive with the feedthrough 122 so as to form edges of the base 128 which engage a back wall and opposite side walls of the feedthrough 122. Again, this greatly minimizes the surface area contact between the ceramic of the feedthrough 122 and the housing 130, in accordance with the invention.

Figure 18:
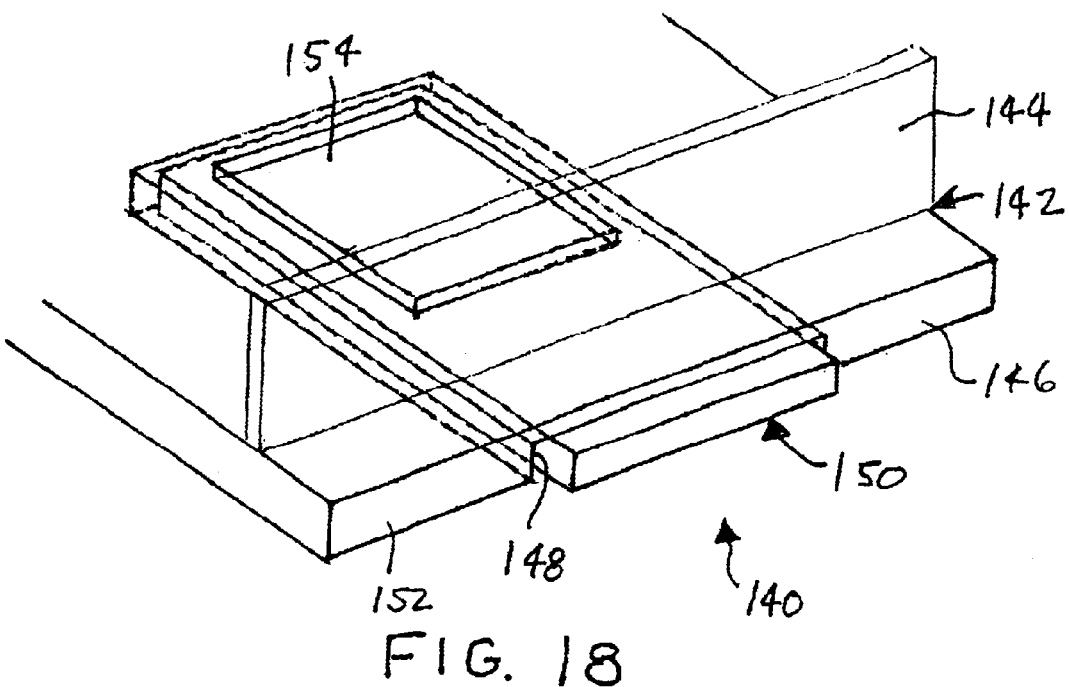
FIG. 18 is a perspective view of a still further alternative embodiment of a feedthrough assembly in accordance with the invention.

FIG. 18 is a perspective view of a still further alternative embodiment of a feedthrough assembly 140 in accordance with the invention. The feedthrough assembly 140 is comprised of a housing 142 having a side wall 144 extending upwardly from a generally planar base 146. Unlike the prior feedthrough assemblies discussed, the feedthrough assembly 140 of FIG. 18 does not have an opening in the sidewall 144 for receiving a feedthrough. Instead, the base 146 is provided with a slot 148 therein for receiving a feedthrough 150 therein. The slot 148 is generally rectangular in shape, as is the feedthrough 150. The slot 148 extends upwardly through a substantial portion of the thickness of the base 146, so as to receive the feedthrough 150 therein. However, a small portion of the thickness of the base 146 between the top of the slot 148 and an upper planar surface of the base 146 extends over part of the feedthrough 150. A portion of such thickness on the opposite side of the sidewall 144 from an outer edge 152 of the base 146 is provided with a generally rectangular opening 154 therethrough. Whereas the generally rectangular slot 148 and the generally rectangular feedthrough 150 are similar in size, the opening 154 which is generally rectangular in shape is somewhat smaller. However, because of the opening 154, the surface area of contact between the ceramic feedthrough 150 and the housing 142 is minimized, in accordance with the invention. At the same time, the opening 154 provides access such as for electrical connections between the feedthrough 150 and the interior of the housing 142.

While the invention has been described in terms of preferred embodiments, those skilled in the art will recognize that the invention can be practiced with modification within the spirit and scope of the appended claims.

What is claimed is:

1. Feedthrough apparatus comprising the combination of a housing having an opening therein and having a member with a surface at the opening, and a feedthrough extending through the opening in the housing and forming an interface with the housing, the feedthrough being brazed to the housing at the interface, the surface of the housing extending at least to the feedthrough, and the member having an opening herein adjacent the feedthrough to minimize surface area contact at the interface between the feedthrough and the housing, wherein the feedthrough is made of a first material having a given coefficient of thermal exuansion and the housing is made of a second material having a coefficient of thermal expansion which is substantially different from the given coefficient of thermal expansion of the first material.

2. Feedthrough apparatus in accordance with claim 1, wherein the opening in the member has edges which extend from side walls of the feedtbrough under the feedthrough by small distances.

3. Feedthrough apparatus in accordance with claim 1, wherein the feedthrough is made of ceramic.

4. Feedthrough apparatus comprising the combination of a housing having an opening therein and having a member with a surface at the opening, and a feedthrough extending through the opening in the housing and forming an interface with the housing, the feedthrough being brazed to the housing at the interface, the surface of the housing extending at least to the feedthrough, and the member having an opening herein adjacent the feedthrough to minimize surface area contact at the interface between the feedthrough and the housing, and wherein the feedthrough is made of ceramic having a given coefficient of thermal expansion and the housing is made of metal having a coefficient of thermal expansion which is substantially different from the given coefficient of thermal expansion of the ceramic.

5. Feedthrough apparatus in accordance with claim 4, wherein the feedthrough is brazed to the housing at the interface therebetween with a silver and copper mixture that brazes at a temperature of at least about 780° C.

6. Feedthrough apparatus comprising the combination of a housing having a generally planar base and an elongated side wall mounted on the base and having an opening therein, and a feedthrough of generally rectangular shape mounted on the housing and extending through the opening in the side wall, wherein the base has a rectangular shaped opening therein beneath the feedthrough to substantially reduce the surface area of contact between the feedthrough and the housing and the feedthrough is made of a first material having a given coefficient of thermal expansion and the housing is made of a second material having a coefficient of thermal expansion which is substantially different from the given coefficient of thermal expansion of the first material.

7. Feedthrough apparatus in accordance with claim 6, wherein the base forms a small ledge around the rectangular-shaped opening beneath a back edge and opposite side edges of the feedthrough of generally rectangular shape.

8. Feedthrough apparatus in accordance with claim 1, wherein the feedthrough is made of ceramic and the housing is made of metal.

\* \* \* \* \*